US006338870B1

(12) United States Patent
Jaccoud

(10) Patent No.: US 6,338,870 B1
(45) Date of Patent: Jan. 15, 2002

(54) PACKAGING LAMINATE WITH GAS AND AROMA BARRIER PROPERTIES

(75) Inventor: Bertrand Jaccoud, Siviriez (CH)

(73) Assignee: Tetra Laval Holdings & Finance S.A., Pully (CH)

(*) Notice: Subject to any disclaimer, the term of this patent is extended or adjusted under 35 U.S.C. 154(b) by 0 days.

(21) Appl. No.: 09/544,220

(22) Filed: Apr. 7, 2000

(30) Foreign Application Priority Data

Apr. 7, 1999 (SE) ............................................... 9901258

(51) Int. Cl.$^7$ ................................................. B05D 3/12
(52) U.S. Cl. ..................... 427/171; 427/173; 427/179; 427/209; 427/255.27; 427/255.31; 427/275; 427/296; 427/452; 427/294
(58) Field of Search ................................. 427/179, 209, 427/255.27, 255.31, 296, 275, 171, 172, 173, 452

(56) References Cited

U.S. PATENT DOCUMENTS

| 5,224,441 A | 7/1993 | Felts et al. |
| 5,508,075 A | 4/1996 | Roulin et al. |
| 5,728,224 A | 3/1998 | Laurent et al. |
| 6,045,916 A | * 4/2000 | Shimamura et al. |

FOREIGN PATENT DOCUMENTS

| WO | 94/11544 | 5/1994 |
| WO | 99/19229 | 4/1999 |

* cited by examiner

*Primary Examiner*—Robert Dawson
*Assistant Examiner*—Marc S. Zimmer
(74) *Attorney, Agent, or Firm*—Burns, Doane, Swecker & Mathis, L.L.P.

(57) ABSTRACT

A packaging laminate (10) including a substrate film (15) coated with a carbon containing silicon oxide layer (16, 17) on both surfaces is disclosed herein. A method for producing the laminate (10), and blanks and packages fabricated from the laminate are also disclosed herein. The PECVD process of the present invention strains the substrate film (15) during deposition thereby creating a very thin oxide layer with superior durability, oxygen and aroma barrier properties. The carbon-containing silicon oxide coating (16, 17) has a stoichiometry of $SiO_xC_y$ in which x is witin the range of 1.5–2.2 and y is within the range of 0.15–0.80. The substrate film (15) may include a core layer (12) of a material selected from the group consisting of paper, paperboard, a foamed core, polyethylene terephtalate, polyamide, polyethylene and polypropylene.

8 Claims, 5 Drawing Sheets

PACKAGING LAMINATE WITH GAS AND AROMA BARRIER PROPERTIES

TECHNICAL FIELD

Figure 1:
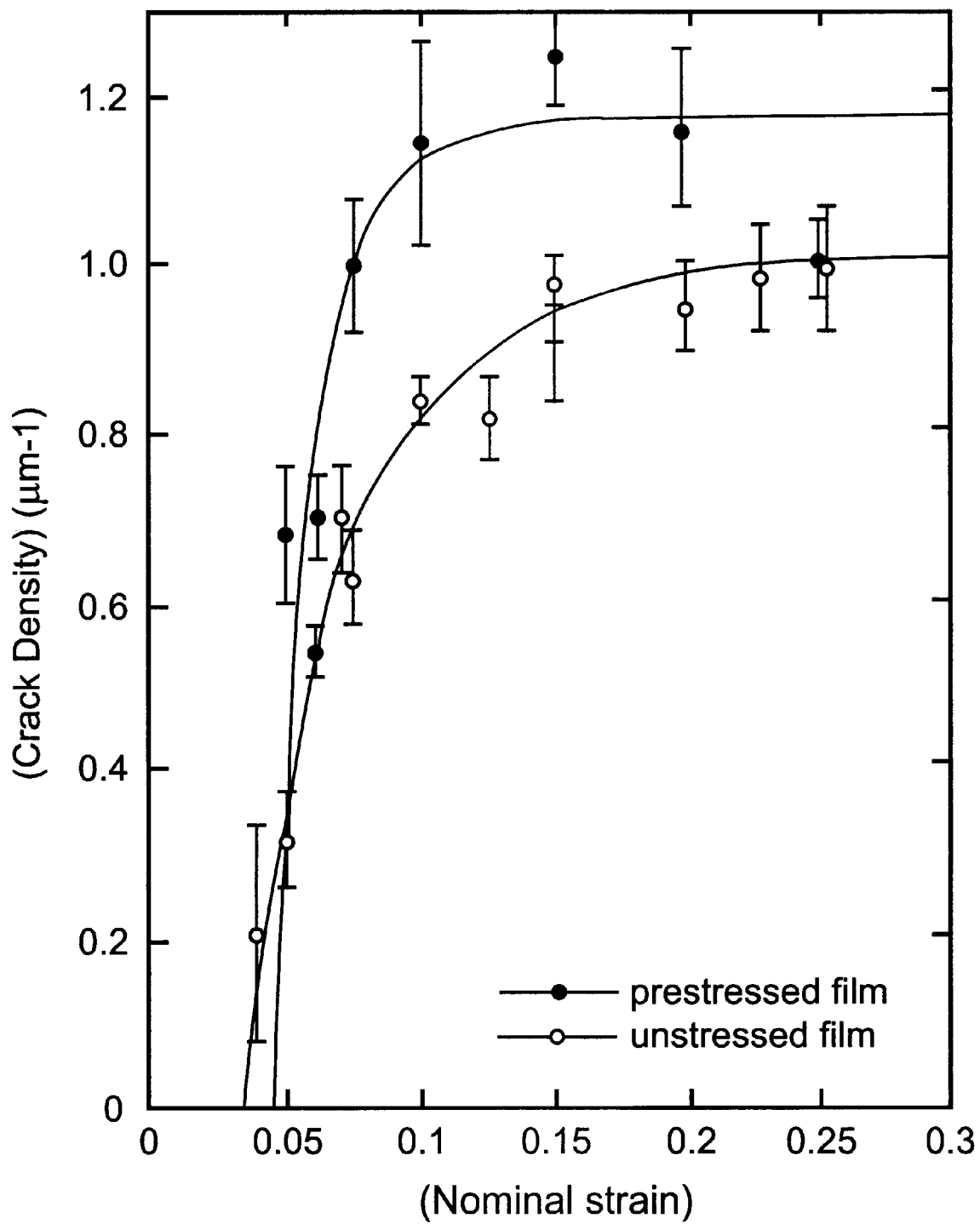

The present invention relates to a method for manufacturing of a packaging laminate having a thin silicone oxide coating formed on each side of a substrate plastics film, a packaging laminate manufactured by the method and a packaging container, as well as a packaging material blank, manufactured from such a packaging laminate.

BACKGROUND ART

Laminated packaging materials having flexibility have been used for packaging liquid food products for many years. For example, milk has been packaged in cartons made from a laminate composed of paperboard substrate with thermoplastic coatings on both surfaces. The surfaces of the carton are heatsealed together so as to form a package carton of desired shape.

Some food products, such as orange juice, packaged in such cartons, lose their nutritional values due to the permeation of oxygen through the carton walls. It has therefore been common to include an aluminum foil layer with the laminate material, in order to reduce the permeation of oxygen through the walls and to minimize the degradation of the nutrients such as vitamin C. Although aluminum foil is highly effective as a barrier material, its use in cartons may in some cases raise concern from environmental and recycling points of view and it may be deemed appropriate to replace aluminium foil by other barrier materials. Various attempts have been made to develop practical alternatives to aluminum foil. Such alternatives should have excellent oxygen, gas and aroma barrier properties, and be easily disposable after use.

Another problem in the packaging of liquid food products in cartons arises from the structure of the carton. The carton is fabricated from a carton blank or a carton web (composed of a laminate such as the ones discussed above) that is folded along one or more crease lines for formation into the desired shape. In general, portions of the blank are overlapped for sealing which may be accomplished by the application of suitable adhesive or by heat-sealing the thermoplastic layers together. The creasing of the laminate material as mentioned above imposes stresses to the laminated material. These stresses may cause leakage or, at least weaken the laminate material so that subsequent handling of the carton may lead to leakage.

New oxygen barrier materials have emerged from recent developments in plasma deposition technology for plastics films. The food and pharmaceutical packaging industries have shown tremendous interest in substrate films, usually of thermoplastic polyester, coated with a thin silicon oxide layer. These materials show excellent barrier properties as well as tolerance to the thermomechanical stress encountered during the various converting processes in the manufacture of laminated packaging materials.

U.S. Pat. No. 4,888,199 describes the process of depositing a thin film of a silicon oxide on a surface with the use of plasma under controlled conditions. The plasma is formed in a closed reaction chamber, in which the substrate is positioned. The above-mentioned substrate can be formed from metal, glass or certain plastics. The air is pumped out of the chamber until a high degree of vacuum is achieved. For example, the organic silicon compound such as hexamethyl disiloxane is introduced into the chamber together with oxygen and helium, so the silicon molecules and oxygen molecules are deposited on the surface of the substrate. The resulting film is described as being a thin film that is very hard, scratch-resistant, optically clear and adheres well to a flexible substrate. The disclosure of the patent is hereby incorporated into this specification by reference.

An improved plasma enhanced chamical vapour deposition (PECVD) method process is described in U.S. Pat. No. 5,224,441, which is also incorporated into this specification. In the process mentioned in the patent, the substrate deposited with the silicon oxide is maintained at a temperature of about 10–35° C., preferably 15–25° C. and the substrate may be formed from polyethylene terephthalate (PET) or polycarbonate resin. In this specification, the thickness of the silicon oxide film when used for food packaging, is about 100 Å (Angstrom)–400 Å and the thickness of the substrate is 1.5 microns –250 microns.

However, during these processes, a major concern is the durability of the barrier layer in that it must not crack or delaminate (detach) from the substrate film. Tendency to cracking is controlled by the cohesion of the oxide material to itself, whereas delamination is controlled by the interfacial adhesion between the oxide layer and the substrate film. Thus there remains a need for a silicon oxide coated substrate that is resistant to cracking and delamination, for providing packages having improved gas barrier and durability properties.

OBJECTS AND SUMMARY OF THE INVENTION

In view of the deficiencies of conventional barrier laminate materials such as presented above, it is an object of this invention to provide a packaging laminate material having improved barrier and durability properties.

It is a further object of this invention to provide a laminated packaging material that is flexible, and readily capable of being formed into packages, filled and sealed, using conventional packaging machines, thus resulting in packages having improved barrier properties.

Furthermore, it is an object to provide a laminated packaging material that may be readily disposed or recycled without or with reduced detriment to the environment.

Moreover, it is further an object of the invention to provide a laminated barrier packaging material having improved durability to thermomechanical stresses encountered during various converting processes in the manufacturing of laminated packaging materials and of packaging containers.

These objects are accomplished by a packaging laminate including a substrate plastics film having a silicon oxide coating formed on each side thereof, being manufactured by a method which comprises a step for obtaining said silicone oxide coatings by means of vapour-depositing a silicon oxide coating onto each side of the substrate film by a plasma method chemical vapour deposition method (PECVD) while straining the film within a range between an upper limit of an intial plastic deformation, determined by the Young modulus of the substrate, and a lower limit of any improvement of a cohesion force in the oxide coating and an adhesion force, i.e. interfacial shear strength, between the oxide coating and the substrate film.

According to preferred and advantageous embodiments of the invention, a method and a packaging laminate as set out in claims 2–7 and claims 8–12, respectively is provided.

According to a further aspect of the invention, a packaging container manufactured from the packaging laminate of the invention is provided, as set out in claims 13–19. Furthermore, a package blank comprising the packaging laminate of the invention is provided as defined in claims 20 and 21.

The silicon oxide coatings, vapor-deposited by a plasma CVD method, are preferably carbon-containing silicone oxide coatings. The preferred carbon-containing silicone oxide has the following general formula;

SiOxCy in which x is within the range of preferably 1.5–2.2, y is within the range of 0.15–0.80, more preferably x is within the range of 1.7–2.1, y is within the range of 0.39–0.47.

The oxide coating may not be limited to these three elements due to impurities occurring throughout the manufacturing process of the laminate. The silicon oxide coating may also contain hydrogen atoms in varying amounts, depending on the precursor compounds employed.

The silicon oxide is usually formed by means of plasma discharge containing a gas mixture of oxygen, helium and organic silicon compounds (silicon precursor compounds that contain carbon). The organic silicon compounds may contain a lot of carbon atoms that participate in the plasma discharge. Some of the carbon atoms may be incorporated in the deposited layer, while the remaining carbon atoms are exhausted from the system in the form of carbon oxide ($CO_1$ $CO_2$), water and various gaseous hydrocarbons.

Plasma enhanced chemical vapor deposition method (PECVD) is a known technique for fabricating silicon oxide coated substrate films. The present invention improves upon that technique by straining the substrate film during deposition and controlling the quantity of oxygen in the gas mixture to create an oxide with the proper stoichiometry.

Figure 2:
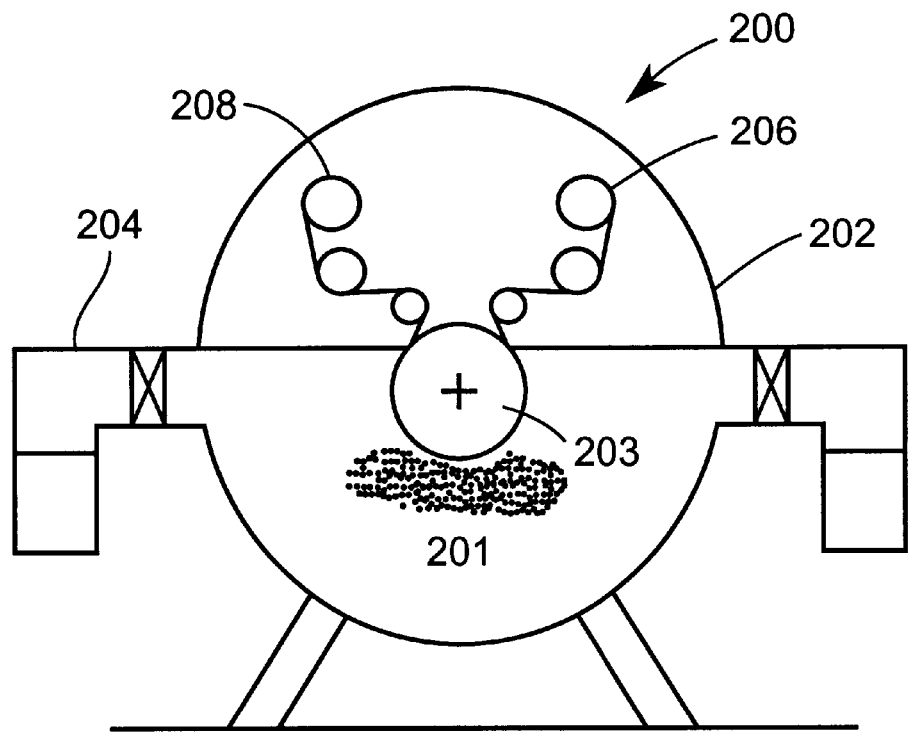
Figure 3:
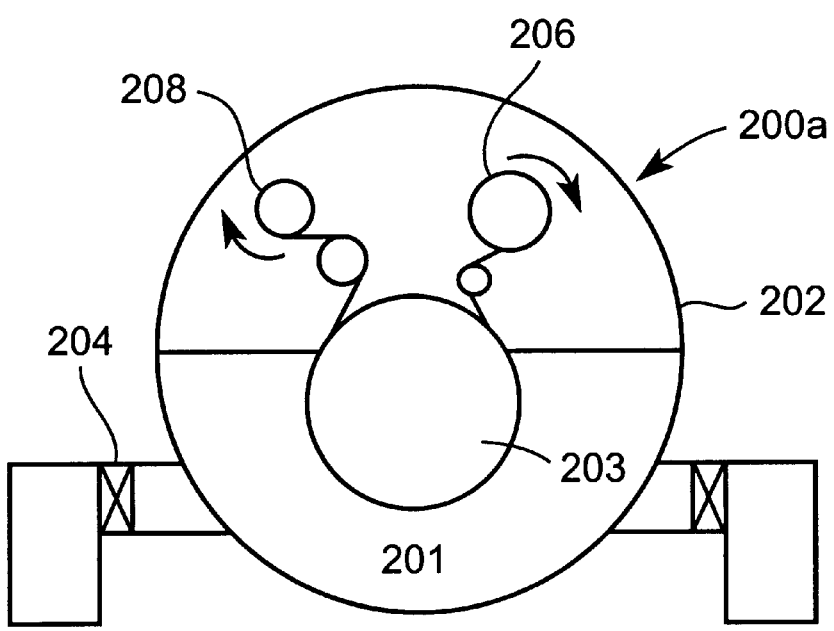

Examples of devices employed in the continuous method of manufacturing according to this invention are shown in the FIGS. 2 and 3. These examples of devices each consists of a vacuum chamber forming the process zone, a plasma generator, a pump connected to the chamber, a means of feeding the raw material mixed gas to the chamber, a drum for passing the plastics substrate film through the vacuum chamber and facilitating vapor-deposition of the oxide onto the substrate film and a roll for unwinding (feeding) the substrate film for supplying to the vacuum chamber and a rewinding roll for pulling and winding the obtained film from the vacuum chamber.

In the examples of the devices according to the invention, an electric motor for the unwinding roll and an electric motor for the rewinding roll are controlled and the strain power of the substrate film according to the invention is within the following range; The range between an upper limit showing no plastic deformation, which is determined by the Young modulus of the substrate, and a lower limit showing any improvement of a cohesion force of the oxide coating and an adhesion force between the oxide coating and the substrate.

When the device involves no drum, the straining of the substrate during plasma vapour-deposition may be carried out in a similar way.

For example, a mixture of vaporized organic silicon compound such as tetra methyl disiloxane (TMDSO) or hexa methyl disiloxane (HMDSO) and inert gas (e.g. helium) and oxygen gas is fed into the vacuum chamber. Preferably, the organic silicon compound is tetra methyl disiloxane (TMDSO). When the plasma is ignited, the vaporized silicon compound reacts with the oxygen to form a silicon oxide compound, which is bonded to the cool substrate film in the vacuum chamber.

By regulating the quantity of oxygen in the gas mixture that is fed into the vacuum chamber, it is possible to control the chemical reaction within the vacuum chamber so that the thus-formed silicon oxide can have a formula SiOxCy, in which x is within the range of 1.5–2.2 and y is within the range of 0.15–0.80, and more preferably x is 1.7–2.1 and y is within the range of 0.39–0.47. It has been proved that the carbon-containing silicon oxide formed within this range has optimal oxygen gas and aroma barrier properties.

The result of measurements of the average atom concentrations, when analyzing the carbon-containing silicon oxide coating obtained by the method of manufacturing according to this invention by the ESCA method, has shown 30.1±5.0% of silicon, 57.3±5.0% of oxygen, 12.6±5.0% of carbon. From a stoichiometric perspective, the carbon containing silicon oxide has an average stoichiometry of $SiO_{1.90}C_{0.419}$.

The carbon-containing silicon oxide coating is obtained by vapor-deposition onto the substrate film by means of a plasma CVD method while straining the substrate film within a range between the upper limit showing no plastic deformation, determined by the Young modulus of the substrate, and the lower limit showing any improvement of a cohesion force of the oxide coating and the adhesion force between the oxide coating and the substrate.

The silicon oxide compound is directly formed on the surface of the substrate. The compactness of the thus-formed silicon oxide layer on the substrate or the core layer becomes sufficiently high from a barrier perspective once the strained substrate film is released or no longer under the tensioning force. As a result of this process, the silicon oxide layer can be made very thin without any loss of the desired barrier properties.

The preferable substrate is made of a flexible thermoplastic material, such as polyethylene, polypropylene or polyethylene terephthalate (PET), preferably of PET.

The silicon oxide layer formed by the PECVD method according to this invention is able to withstand substantial elongation without rupture. This characteristic is especially important for use of the laminate material in the packaging of liquid food products, since the typical packaging laminate material has crease lines formed in the surface of the laminate to facilitate the bending and folding of the material into a package. The ability of the silicon oxide layer to be deformed without rupture substantially decreases the possibility of leakage along the crease lines.

By employing double layers of such carbon-containing silicon oxide barrier coatings produced by plasma chemical vapor deposition while stretching the substrate film within the range as set out above, in a packaging laminate, the risk of cracks appearing in the barrier layers and delamination from the substrate layer due to folding and bending of the material may be reduced even further.

Normally, the substrate film will be coated on each side in a separate plasma CVD coating step, i.e. the plasma coating process is a batchwise process.

A particular advantage with the method according to the present invention is, that the firstly applied silicon oxide coating on the first side of the substrate film will be flexible and durable and thus not crack or detach from the substrate film during the operation of coating the second silicon oxide coating on the second side of the substrate film. Consequently, a flexible film having an intact, flexible and durable silicon oxide coating on each side will be obtained.

DESCRIPTION OF PREFERRED EMBODIMENTS AND THE DRAWINGS

FIG. 1 is a graph showing the evolution of the fragmentation process in function of nominal strain for the plasma CVD oxide coating of the Evaluation Example according to this invention and the Prior Arts Example, respectively.

FIG. 2 schematically illustrates an example of the device for plasma CVD of according to this invention.

FIG. 3 schematically illustrates another example of the device for plasma CVD of according to this invention.

Figure 4:
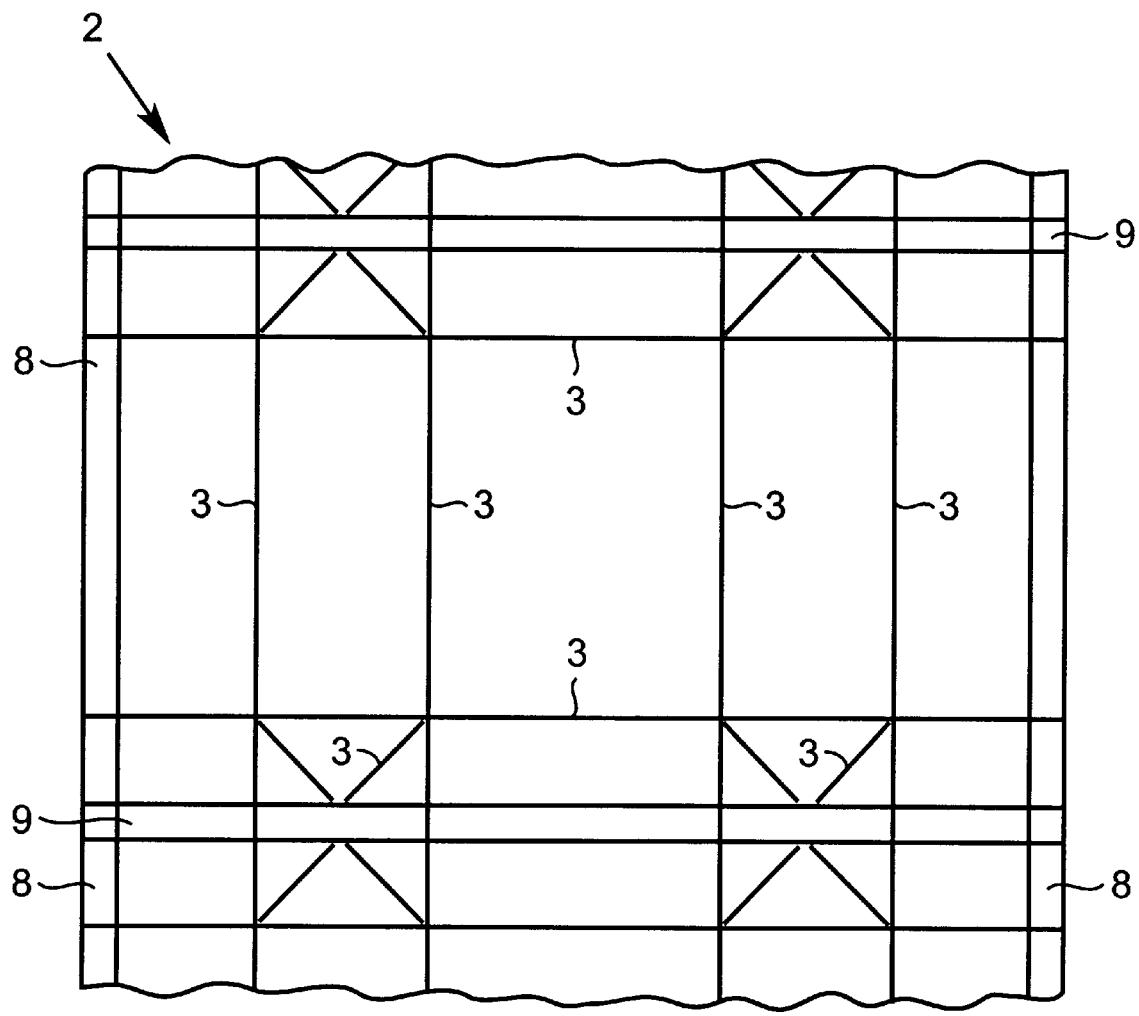

FIG. 4 schematically illustrates an example of the packaging blank having the laminate according to this invention.

Figure 5:
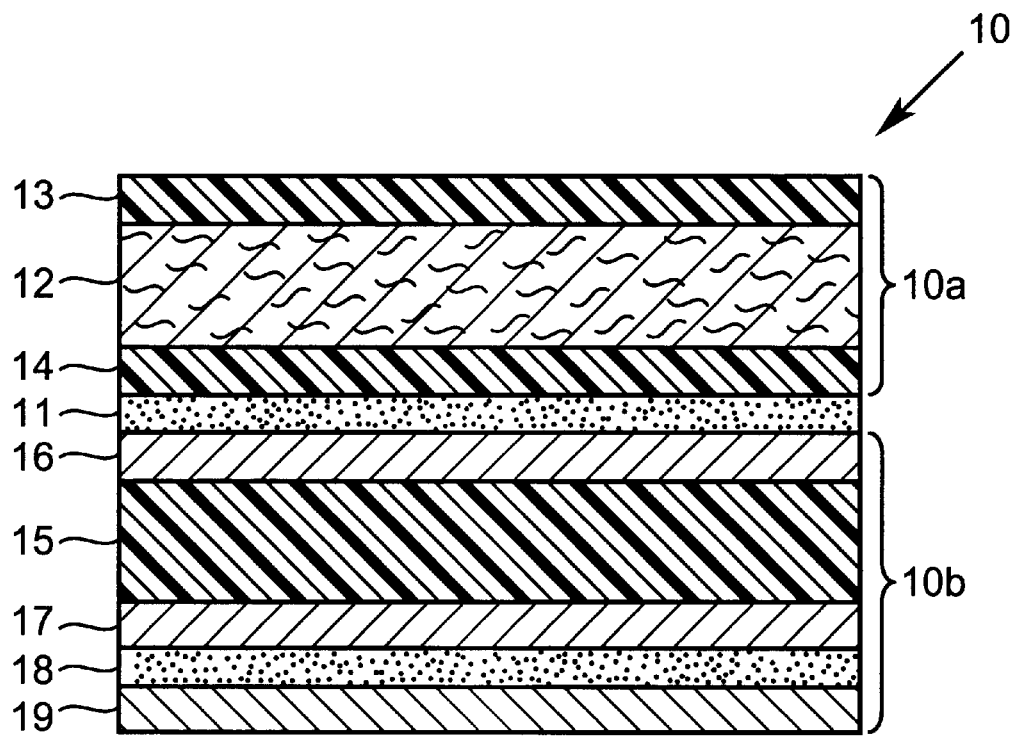

FIG. 5 schematically illustrates the packaging laminate according to the first embodiment of the invention.

Figure 6:
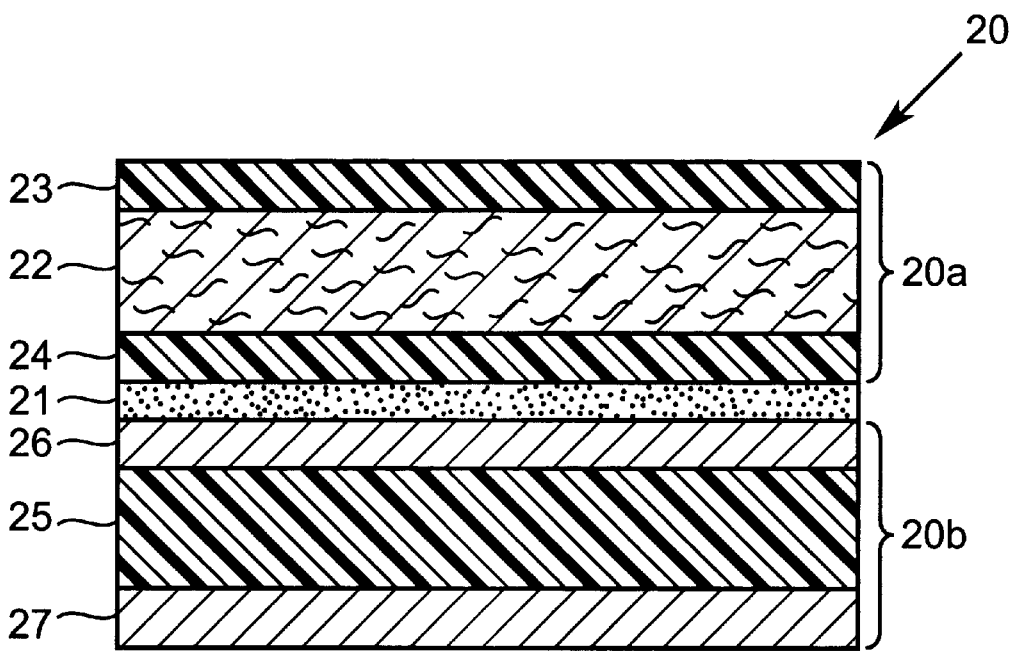

FIG. 6 schematically illustrates the packaging laminate according to the second embodiment of the invention.

Figure 7:
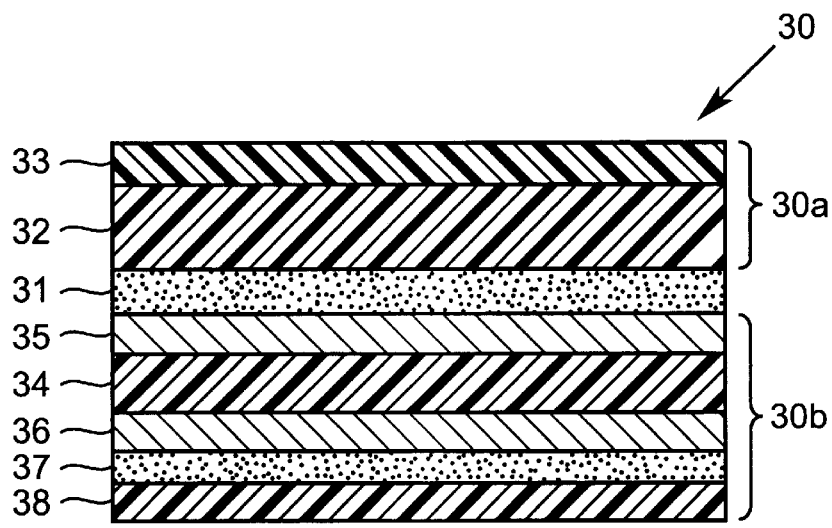

FIG. 7 schematically illustrates the packaging laminate according to the third embodiment of the invention.

Figure 8:
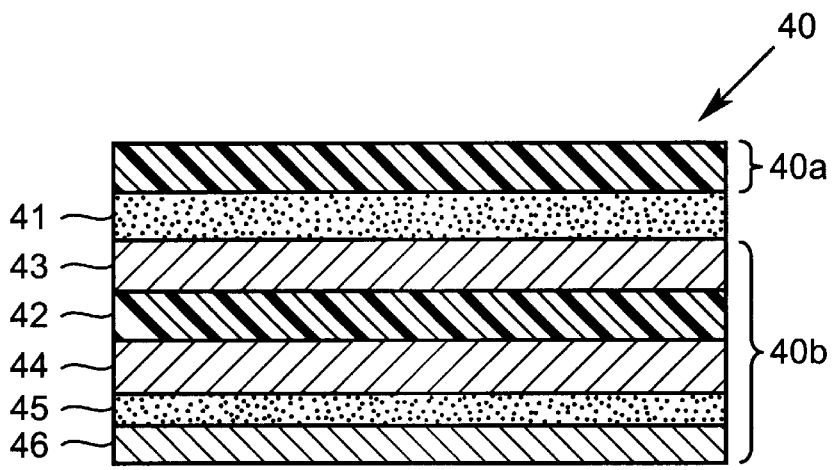

FIG. 8 schematically illustrates the packaging laminate according to the fourth embodiment of the invention.

Figure 9:
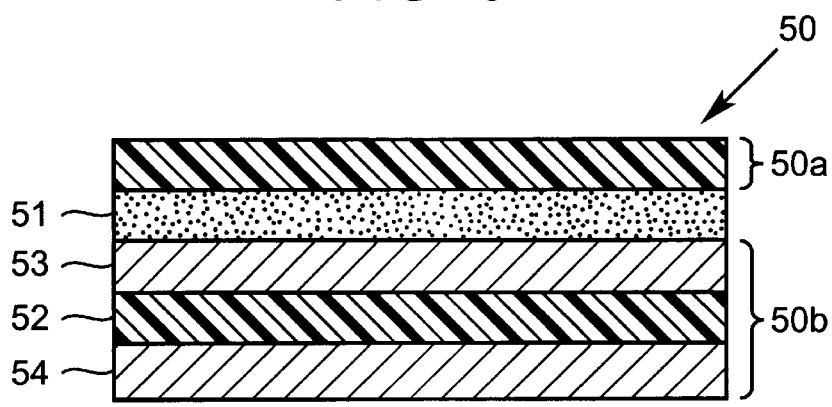

FIG. 9 schematically illustrates the packaging laminate according to the fifth embodiment of the invention.

EVALUATION EXAMPLE; FIG. 1

While pre-straining a substrate film according to this invention, a silicon oxide coating was vapor deposited using the above-mentioned plasma enhanced chemistry deposition method. The effect of the controlled inner compressive stress in the coating was examined by subjecting some PET samples to an elasticity tensile load during the deposition process.

The coated film was subsequently unloaded, resulting in a well-defined level of compression in the coating. The adhesion was derived from the classic stress transfer theory of Kelly and Tyson adapted to the geometry of the coating film to model the fragmentation process of the coating during the strain of the polymer substrate. This theory accounts for a Weibull-type coating strength, and introduces a critical stress transfer strength, related to the average coating fragmentation length at fragmentation saturation, which was found to be the most relevant parameter to describe the level of adhesion.

The results of an Evaluation Example according to this invention and a prior arts example in which an oxide coating was deposited using a plasma enhanced chemical vapor deposition method without straining the substrate film are shown in FIG. 1, respectively. FIG. 1 shows the evolution of the fragmentation process in function of nominal strain for the PECVD oxide coating of the Evaluation Example according to this invention and of the prior arts example respectively.

In the film of the Evaluation Example according to this invention, the crack onset shifted from 4% to 5%, i.e. increased by 25%, as compared to the film of the prior art where no pre-straining is utilized in the coating process. Also, the cohesion force in the carbon-containing silicone oxide layer of the Evaluation Example increased from 4.0 GPa of the prior art film to 5.7 GPa, i.e. by over 40%. Moreover, the interface shear strength with the substrate film in the carbon-containing silicone oxide layer of the Evaluation Example increased from 100 MPa of the prior art film to 170 MPa, i.e. by 70%.

FIGS. 2 and 3 thus illustrate examples of devices capable of manufacturing the packaging laminate of the present invention. These devices 200 and 200a each consists of a vacuum chamber 202 including the plasma process zone 201, a pump 204 connected to the chamber 202 and means of introducing the precursor gas mixture into the chamber, a drum for passing the plastics substrate film through the vacuum chamber and facilitating vapor-deposition of the oxide onto the substrate film, an unwinding roll 206 for feeding the substrate film to the vacuum chamber 202 and a rewinding roll 208 for pulling the obtained film from the vacuum chamber 202. A PECVD method is more thoroughly described in U.S. Pat. No. 5,224,441, which is hereby incorporated into this specification by reference.

Electric motors may be used for the unwinding roll 206 and the rewinding roll 208. The motors allow for control of the strain (tensioning force) on the substrate film. In practicing the present invention, the substrate film is strained in a range having an upper limit prior to the plastic deformation of the substrate film as determined by the Young modulus of the substrate, and a lower limit of an improvement in the cohesion force of the oxide coating, and in the adhesion force between the oxide coating and the substrate film. If the drum is absent, the straining of the substrate during vapour-deposition is still applied in a similar manner.

For example, a gas mixture of oxygen, an inert carrier gas (such as helium) and a vapourised organic silicon copound such as TMDSO or HMDSO is fed into the vacuum chamber. When the plasma is ignited, the vapourised silicon compound reacts with the oxygen to form a silicon oxide compound. The compound is deposited on and chemically bonded to the cool substrate film in the vacuum chamber 202.

Liquid food products such as milk and juices are usually being packaged in carton packages formed from the laminated packaging material as described above. The packages may be in form of gable top cartons or block-shape cartons. A gable top carton is formed from a precut blank that is fed to a filling machine. The machine folds the blank into a package capsule, which is subsequently sealed together longitudinally and at the bottom, filled with liquid food product and finally closed and sealed at the top of the carton.

A block- or brick-shaped package may be formed directly from a continuous web of the packaging material. The web of laminated packaging material is shaped into a tube, sealed longitudinally along the tube, filled with the liquid food product and transversally sealed across the tube into pillow-shaped packages by means of heat sealing, which packages are finally cut off from the tube. Finally, the flaps of the pillowshaped containers are sealed to the sides of the package in order to shape it into a parallelepipedic block- or brik-shaped packaging container. In both types of gable-top and block-shaped packages, the packaging material is provided with crease lines to facilitate folding along predetermined lines. These methods of manufacturing of packages are well known in the field of packaging.

A packaging blank 2 formed from the continuous web of the laminate material is shown in FIG. 4. As shown in FIG. 4, crease lines 3 are stamped, or otherwise impressed into the surface that is to become the inner surface of the carton. Packaging laminate blanks 2 normally have a core layer of paper or paperboard, a barrier layer, an inner products contact layer of for example low-density polyethylene (LDPE) and an outer thermoplastic material layer, also usually of LDPE.

Crease lines cause indentations generally in the inner LDPE layers, in the barrier layers and in the paperboard core layer. After the blanks have been folded into the cartons and closed, the seal portion 8, as shown in FIG. 4, is sealed by heat at temperatures of from about 121° C. to about 260° C. in order to bond the inner and outer LDPE layer portions 8 together. The blanks 2 are cut from each other in the cutting portion 9 and separated into individual packaging blanks 2, one for each packaging container to be formed.

The silicon oxide coatings obtained from the plasma CVD method according to this invention have a higher ductility than silicon oxide coatings formed by the conventional plasma CVD method. The packaging laminate materials of the present invention may be folded and heat-sealed on a conventional packaging machine without cracks and/or holes appearing in the barrier layer.

It is desirable to make the silicon oxide layer thin, since it allows the coating process to proceed faster. Furthermore, in order to utilize the barrier layer produced in the plasma enhanced chemical vapor deposition process as a packaging laminate for food products, certain additional layers should be included, such as adhesive layers and heat sealable layers of thermoplastic polymer. A thick coating on the substrate tends to cause curling of the laminate, which makes such later lamination and fabrication more difficult than with a thin coating.

A preferred embodiment of the packaging laminate material according to this invention is shown in FIG. 5. The packaging laminate 10 comprises two prefabricated laminates 10a and 10b that are bonded to one another by intermediate layer 11 of adhesive. The 1st laminate material 10a has a rigid but foldable core layer of paper or paperboard 12, and two outer layers 13 and 14 of heat-sealable thermoplastic polymers such as for example LDPE.

The core layer may alternatively comprise any other suitable material that is flexible, such as paper, foamed or expanded polymer, a thicker polymer layer, e.g. of PET, polyamide, polyethylene or polypropylene.

The 2nd laminate material 10b has a substrate or carrier layer 15 onto each side of which thin carbon-containing silicone oxide layer 16 and 17 have been deposited by PECVD method. The layers 16 and 17 act as oxygen gas and aroma barriers and consist of a carbon containing silicone oxide.

The carbon-containing silicone oxide layers 16 and 17 deposited on the substrate or the carrier layer 15 by PECVD method have the thickness of between 50–500 Å, with a preferred thickness of about 200 Å or 193 Å. This thickness imparts the desired oxygen gas barrier property, which is about at the same level as that of an aluminium foil, to the packaging laminate material 10.

The substrate layer 15 consists of flexible plastics, such as for example polyethylene terephthalate (PET), amorphous polyester, biaxially oriented polyester or polypropylene.

The outer side of the outer carbon-containing silicone oxide layer 17 is coated with an outer layer of heat-sealable thermoplastics 19 of, for example LDPE. The layer 19 is heat-sealable at the temperature among 121° C.–260° C. with the thermoplastics outer layer 23 of laminate 20a and is bonded to the substrate or carrier layer 25 with the aid of an intermediate adhesive or adhesive polymer 28.

FIG. 6 shows another embodiment of the packaging laminate according to the invention for producing a packaging possessing superior oxygen gas and aroma barrier properties by fold formation and sealing. The packaging laminate 20 comprises a 1st laminate unit 20a and a 2nd laminate unit 20b which are bonded to one another by an intermediate adhesive layer 21. The 1st laminate unit 20a comprises a rigid but foldable layer 22 of paper or paperboard and outer LDPE layers 23 and 24.

The 2nd laminate material unit 20b has a substrate or carrier layer 25. The substrate or carrier layer 25 is a flexible thermoplastic material, which may be heat-sealable at a temperature between 121° C.–260° C. with the LDPE layer 23 to produce packaging for liquid food products. For example, the carrier layer 25 can be formed from LDPE. The packaging laminate 20 is produced by bonding together the first laminate 20a and the second laminate 20b with an adhesive 21 which is applied between the webs for permanent bonding to the webs for the formation of the finished packaging laminate 20.

On its side facing the laminate unit 20a, the substrate or the carrier layer carries a first oxygen gas and aroma barrier layer 26 which comprises carbon containing silicone oxide.

On the opposite side of the substrate layer 25, as a product contact layer towards the inside of a package, a second oxygen gas and aroma barrier layer 27 which comprises carbon containing silicone oxide is deposited. The carbon-containing silicone oxide has the general formula SiOxCy in which x is within the range of 1.7–2.1 and y is within the range of 0.39–0.47.

In the laminate material 20 of the embodiment, the carbon-containing silicone oxide layers acting as oxygen gas and aroma barrier have been produced by PECVD method and each has a thickness of 50–500 Å, preferably 100–200 Å, more preferably about 200 Å, and most preferably 193 Å. This thickness is enough to impart the desired oxygen gas and aroma barrier properties to the packaging container produced from packaging laminate material.

The packaging laminate 20 may be produced by bonding together the prefabricated web of the laminate unit 20a and the prefabricated web of the laminate unit 20b by means of an adhesive layer which is applied between the two webs for the formation of the finished packaging laminate 20.

Since the carbon-containing silicon oxide layer 27 is exposed on the interior side of the laminate, when the laminate is folded and heat-sealed to form a container, the carbon-containing silicon oxide layer 27 will be in direct contact with the contents of the container.

When the laminate is used for food product container, the carbon-containing silicon oxide layer 27 is an acceptable material for this purpose, since it would have no deleterious effect on the food contents. Since the carbon-containing silicon oxide layer 27 is very thin, a strong heat seal bond can be formed between the exterior layer 23 and the interior layer 25 when the laminate is folded and formed in conventional packaging materials at a heat sealing temperature of between 121–260° C. Another way to form a bond using the packaging laminate 20 is to employ ultrasonic heating which cause softening of the LDPE layer 25 without requesting the transmission of heat through the carbon-containing silicon oxide layer 27.

As an example of a preferred packaging laminate in accordance with the embodiment of FIG. 6, the exterior LDPE layer 23 should have a thickness of about 15 microns and the interior LDPE layer 25 should have a thickness of about 15 microns. The carbon-containing silicon oxide layers 26 and 27 should have a thickness of between 50 and 500 Å.

A laminate having layers of these thickness will have good barrier properties and will be capable of being formed into packages by heat-sealing without causing holes or tears that might cause the packages to leak.

FIG. 7 shows a further embodiment of a packaging laminate according to the invention for producing a package possessing superior oxygen gas and aroma barrier properties by fold formation and sealing. The packaging laminate material 30 comprises a first laminate unit 30a and a second laminate unit 30b which are permanently bonded to one another by an intermediate adhesive layer 31. The 1st laminate unit 30a comprises a rigid but foldable core layer 32 of a heat-sealable plastic material, e.g., foamed or expanded polyethylene, foamed or expanded polypropylene, formed or expanded polyester, or mineral-filled polypropylene, and an outer layer 33 of heat-sealable thermoplastic that is capable of being bonded to the core layer 32 by heat sealing.

The second laminate unit 30b comprises a substrate or carrier layer 34 of plastics which, on each side carries a layer 35 and 36 acting as oxygen gas and aroma barriers and consisting of a silicon oxide of the general chemical formula SiOx in which x may vary within 1.7–2.1 and y may vary within 0.39–0.47. The silicon oxide layers 35 and 36 are covered by an outer layer of thermoplastic 38 which is heat-sealable with the thermoplastic in the outer thermoplastic layer 33 of the laminate unit 30a and which is bonded to the silicon oxide layer 36 by means of an intermediate adhesive layer 37. Alternatively, another method of forming the laminate 30 is by extrusion laminating the laminate 30a to the silicon oxide coated substrate film laminate 34, 35, 36 by means of the intermediate layer 31 and then coextruding layers 37 and 38 against this laminate onto the outer silicon oxide layer 36.

In the laminate of this embodiment, the carbon-containing silicone oxide layers 35 and 36 are produced by plasma enhanced chemical vapor deposition while straining the substrate film 34 according to the invention, which has proved to be fully sufficient to impart superior oxygen gas and aroma barrier properties to a packaging container produced from the packaging laminate 30.

FIG. 8 shows a further embodiment of a packaging laminate according to the invention for producing a package of the bag type, without a paper or paperboard core layer, possessing superior oxygen gas and aroma barrier. The packaging laminate 40 comprises a first prefabricated laminate unit or flexible plastic film 40a and a second prefabricated laminate unit 40b which are permanently bonded to one another by an intermediate adhesive layer 41.

The first laminate unit or plastic film 40a preferably consists of a single layer of a flexible heat-sealable thermoplastic, e.g., polyester, polyethylene or polypropylene, that is capable of being heat-sealed at a temperature of 121° C.–260° C. in a conventional heat-sealing machine.

The second laminate unit 40b comprises a substrate or carrier layer 42 which, on both sides carries layers 43 and 44, acting as oxygen gas and aroma barriers and consisting of a silicon oxide of the general chemical formula SiOxCy in which x may vary within 1.7–2.1 and y may vary within 0.39–0.47.

In the laminate 40 of the embodiment, the carbon-containing silicone oxide layers 43 and 44, acting as oxygen gas and aroma barriers, have been produced by PECVD method and has a thickness of 50–500 Å, preferably 100–200 Å, e.g. about 200 Å, more preferably the thickness of 193 Å. This thickness is enough to impart the desired oxygen gas and aroma barrier properties to a packaging container produced from the packaging laminate 40.

FIG. 9 schematically illustrates a packaging laminate 50 according to the invention for producing a package of the bag type, without a paper or paperboard core layer. The packaging laminate 50, comprises a first prefabricated laminate unit or flexible plastic film 50a and a second prefabricated laminate unit 50b which are permanently bonded to one another by an intermediate adhesive layer 51.

The first laminate unit or plastic film 50b consists of a single layer of a flexible heat-sealable thermoplastic, e.g., polyester, polyethylene or polypropylene, that is capable of being heat-sealed at a temperature of 121° C.–260° C. in a conventional heat-sealing machine.

The second laminate unit 50b comprises a substrate or carrier layer 52 which, on both sides carries layers 53 and 54 acting as oxygen gas and aroma barriers and consisting of a silicon oxide of the general chemical formula SiOxCy in which x may vary within 1.7–2.1 and y may vary within 0.39–0.47.

The substrate or carrier layer 52 consists of a thermoplastic which is flexible and heat-sealable at a temperature between 121–260° C. to the thermoplastic layer in the first laminate unit. In the laminate 50 of the embodiment, the carbon-containing silicone oxide layer 53 acting as oxygen gas and aroma barrier has been produced by PECVD method and has a thickness of 50-500A, preferably 100–200 Å, more preferably 200 Å, most preferably the thickness of 193 Å. This thickness is enough to impart the desired oxygen gas and aroma barrier properties to the packaging container produced from packaging laminate 50.

The packaging laminate 50 is produced by bonding the thermoplastic layer of the first laminate unit 50a to the second laminate layer 50b by means of an adhesive layer 51 which is applied between the two units. The laminate 50 may be formed into packages as described above, including forming crease lines in the inner layer 50a and practically into the barrier layer 53. These crease lines facilitate folding of the laminate along predetermined lines. Since all of the layers of the laminate 50 are flexible, this laminate can be used to produce a flexible wall package.

Since the carbon-containing silicon oxide layer 54 is exposed on the interior side of the laminate, when the laminate is folded and heat-sealed to form a container, the carbon-containing silicon oxide layer 54 will be in direct contact with the contents of the container.

When the laminate is used for food product container, the carbon-containing silicon oxide layer 54 is an acceptable material for this purpose, since it would have no deleterious effect on the food contents. Since the carbon-containing silicon oxide layer 54 is very thin, a strong heat seal bond can be formed between the exterior layer 50a and the interior layer 52 when the laminate is formed into conventional packaging containers at a heat sealing temperature of between 121–260° C. Another way to form a bond using the packaging laminate 50 is to employ ultrasonic heating which cause softening of the thermoplastic layer 52 without requesting the transmission of heat through the carbon-containing silicon oxide layer 54.

As an example of a preferred packaging laminate in accordance with the embodiment of FIG. 9, the exterior LDPE layer 50a should have a thickness of about 15 microns and the interior LDPE layer 52 should have a thickness of about 15 microns. The carbon-containing silicon oxide layers 53 and 54 should have a thickness of between 50 and 500 Å.

A laminate having layers of these thickness will have good barrier properties and will be capable of being formed into packages by heat-sealing without causing holes or tears that might cause the packages to leak.

Thus, according to the invention, there will be realized a packaging laminate of the type described by way of introduction possessing excellent oxygen gas and aroma barrier properties without attendant problems and drawbacks of the type inherent in the prior art technology, for example European Patent Application Published under number 0 378 990.

In particular, there will be realized a packaging laminate including a carbon-containing silicon oxide produced by chemical plasma vapor deposition and, even at such slight thickness as 193 Å, making possible the production, by fold formation, of a packaging container possessing superior oxygen gas and aroma barrier properties.

By employing double layers of such carbon-containing silicon oxide barrier coatings produced by chemical plasma vapor deposition in a packaging laminate, the risk of cracks appearing in the barrier layers due to folding and bending of the material may be reduced to a negligible extent or even eliminated.

While the invention has been described above with reference to specific laminate structures, it is naturally not restricted exclusively to such structures. Without departing from the spirit and scope of the inventive concept as defined in the appended claims, it is possible, and obvious to a person skilled in the art, to select other materials in respect of both the substrate or carrier layer and the core layer than those specifically disclosed herein. For example, it is possible, within the purview of the inventive concept as herein disclosed, to employ as material for the substrate or carrier layer a layer of greaseproof paper, where desired.

The laminate material of this invention has a gas-barrier layer that is effective in thickness as low as 50 Å, and in a preferred thickness of 200 Å. The advantage of the thin coating resides principally in the excellent mechanical properties that are related to their lower internal stresses. This means that such thin coatings have better resistance to cracking which is particularly important in case of the containers formed by creasing and folding as described in this specification.

The corners and folded edges of such containers are particularly sensitive areas and the use of materials with thicker coatings will result in cracks in these parts of the package and consequent loss of barrier properties. In contrast, the thin coatings as disclosed in this application are sufficiently flexible and extensible to make possible a conversion of the material to packing containers without any danger of cracking or breaking even in the most exposed areas. The lower internal stress of the thin coatings are also reflects in the property that these materials do not curl. Thick coatings on plastic films may cause problems during subsequent processing to produce laminates.

It should finally be observed that a packaging laminate according to the invention, in addition to superior oxygen gas and aroma barrier properties, also possesses the advantage that it is of the non-scalping type. As a result the silicon oxide layer of the packaging laminate can be employed in direct contact with package contents which are particularly storage-sensitive, such as fruit juice, without "scalping" or impoverishing the contents of its aromatic flavorings, essential oils, which occur in generous quantities in this type of contents.

What is claimed is:

1. A method for manufacturing of a packaging laminate (10) having a thin silicone oxide coating (16 and 17) formed on each side of a substrate plastics film (15), which comprises a step for obtaining said silicone oxide coatings by means of vapor-depositing a silicon oxide coating (16, 17) onto each side of the substrate film (15) by a plasma chemical vapour deposition (PECVD) method while straining the film, within a range between an upper limit of an initial plastic deformation of the substrate determined by the Young modulus and a lower limit of any improvement of a cohesion force in the oxide coating and an adhesion force between the oxide coating and the substrate film.

2. The method according to claim 1, wherein said silicon oxide coating comprises carbon-containing silicon oxide.

3. The method according to claim 1, wherein said substrate film (15) comprises polyethylene terephthalate.

4. The method according to claim 2, wherein said carbon-containing silicone oxide (16, 17) has the general composition formula;

$SiO_xC_y$, wherein x is within the range of 1.5–2.2 and y is within the range of 0.15–0.80.

5. The method according to claim 2, wherein said carbon-containing silicone oxide layer (16, 17) is formed from a mixture of vaporized organic silicon compound and oxygen in vacuum, the organic silicon compound being either hexamethyl disiloxane or tetrahexamethyl disiloxane.

6. The method according to claim 2, wherein the cohesion strength in the carbon-containing silicone oxide layer (16, 17) is at least 5.7 GPa.

7. The method according to claim 2 wherein the carbon-containing silicone oxide layer (16, 17) has at least 170 MPa of interface shear strength with the substrate film (15).

8. A packaging laminate including a substrate plastic film (15) having a thin silicone oxide layer (16, 17) formed on each side thereof, manufactured by the method according to claim 1.

* * * * *